United States Patent [19]
Uchino et al.

[11] Patent Number: 5,625,584
[45] Date of Patent: Apr. 29, 1997

[54] NON-VOLATILE MULTI-STATE MEMORY DEVICE WITH MEMORY CELL CAPABLE OF STORING MULTI-STATE DATA

[75] Inventors: Takashi Uchino; Nozomu Nambu, both of Gunma; Akio Hagiwara, Saitama, all of Japan

[73] Assignee: Sanyo Electric Co., Ltd., Osaka, Japan

[21] Appl. No.: 697,903

[22] Filed: Aug. 30, 1996

[30] Foreign Application Priority Data

Aug. 31, 1995 [JP] Japan .................................. 7-224382
Aug. 31, 1995 [JP] Japan .................................. 7-224384
Aug. 31, 1995 [JP] Japan .................................. 7-224385

[51] Int. Cl.$^6$ .................................................. G11C 13/00
[52] U.S. Cl. .................................................. 365/45; 365/210
[58] Field of Search ........................ 365/45, 210, 189.01

[56] References Cited

U.S. PATENT DOCUMENTS 5,535,167  7/1996  Hazani ............................ 365/45

FOREIGN PATENT DOCUMENTS 4-500576  1/1992  Japan .
4057294   2/1992  Japan .
9000801   1/1990  WIPO .

Primary Examiner—Terrell W. Fears
Attorney, Agent, or Firm—Loeb & Loeb LLP

[57] ABSTRACT

A data register for holding input digital data, a resistance dividing circuit for generating a plurality of analog voltages, a decoder for decoding the data of the data register and selectively outputting one of a plurality of analog voltages and a comparator for comparing this decoded output with an analog amount read from a memory cell are provided. In write mode, this memory device sets data to be written in the data register and writes an analog amount corresponding to the set data in the memory cell. In read mode, the apparatus sequentially sets in the data register digital data updated in sequence from a designated value, executes comparison at the comparator for each setting and terminates the digital data setting in response to the comparison result at the data register, thus digital data corresponding to the analog amount read from the memory cell is thereby obtained at the data register. As a result, circuit configuration can be simplified and circuit scale reduced.

17 Claims, 11 Drawing Sheets

| DATA | | VOLTAGE |
| --- | --- | --- |
| D1 | D0 | |
| 0 | 0 | V1 |
| 0 | 1 | V2 |
| 1 | 0 | V3 |
| 1 | 1 | V4 |

| OPERATION STATE | DRAIN (BL) | SOURCE (SL) | CONTROL GATE (WL) |
| --- | --- | --- | --- |
| ERASE | 0 V | 0 V | $V_{hv2}$ |
| WRITE 1 | $V_{BLH}$ | $V_{hv1}$ | $V_{B2}$ |
| WRITE 2 | $V_{BLL}$ | $V_{hv1}$ | $V_{B2}$ |
| WRITE STOP | $V_{BH}$ | $V_{hv1}$ | $V_{B2}$ |
| READ | $V_{REFM}$ | 0 V | $V_{B1}$ |

($V_{hv2}$>$V_{hv1}$>$V_{BH}$=$V_{B1}$>$V_{B2}$>$V_{BLH}$=$V_{REFM}$>$V_{BLL}$>0V)

Fig. 11

NON-VOLATILE MULTI-STATE MEMORY DEVICE WITH MEMORY CELL CAPABLE OF STORING MULTI-STATE DATA

BACKGROUND OF THE INVENTION

1. Field of the Invention

The present invention relates to a non-volatile multi-state memory device using an EEPROM (Electrically Erasable Programmable ROM) and the like capable of storing multi-state data.

2. Description of the Prior Art

Alteration of a threshold level by controlling the amount of electric charge injected to a floating gate and storage of analog amounts and multi-state information have conventionally been carried out in a non-volatile memory using EEPROM or such like provided with a floating gate.

For instance, in the published translation of PCT filed patent (JP-T 04 500576) [International Laid-open No. WO 90/00801], electric charge was injected to a floating gate by supplying a high voltage write pulse to a non-volatile memory cell while sample-holding an analog signal to be inputted using an analog sample-holding circuit. Following charge injection, an analog amount corresponding to the injected charge was read out from the memory cell and compared with the sample-held analog signal and an analog amount corresponding to the input analog voltage was thus recorded in the memory cell by repeatedly supplying a write pulse until both these analog amounts match. A step-form pulse row in which voltage value increases gradually over time was used as the write pulse.

In addition, an analog sample-holding circuit of the type described above was installed respectively at each row of the memory array and while one plurality of sample-holding circuits sequentially captures the analog signals, the analog amounts held by the other plurality of sample-holding circuits was simultaneously stored in the memory cell array.

A multi-state memory is a memory for storing dispersed analog amount using a read and write configuration almost identical to that in the abovementioned publication.

In the abovementioned conventional example, since an analog signal to be inputted is held directly in an analog sample-holding circuit there are problems with data holding reliability. In addition, since data cannot be held for a long time in an analog sample-holding circuit, when input analog signals are held sequentially in a plurality of sample-holding circuits. The analog amounts held by a plurality of sample-holding circuits are simultaneously written in a plurality of memory cells after holding, only a small number of memory cells can execute writing simultaneously.

Alternatively, since the configuration is simple one in which an analog signal read from the memory cell is outputted unchanged, it is not unable to execute reading from the memory cell when attempting to transmit an analog signal to an external portion, but when the reading time for one memory cell is longer than the transmission rate to the external portion, reading cannot be completed in time.

Therefore if reading is commenced prior to transmission, the above problem is conceled. However reading of data which does not require reading is still a totally unnecessary operation and the question of at what time the reading operation should most suitably commence remains unsolved.

Furthermore, in the abovementioned conventional example, since the analog amount corresponding to an analog signal to be inputted was written in a single memory cell it was necessary to carefully control the amount of charge injected to the floating gate, requiring a memory cell with minimal variation and a complex writing circuit.

Another conventional example was disclosed in for instance the published patent (JPB 4-57294) which disclosed a non-volatile multi-state memory device wherein, in addition to latching digital data to be inputted in a data latching circuit, the multi-state storage state is read out and a sense amp is provided for outputting a digital value corresponding to this storage state. A comparator then compares this sense amp output with the data held in the data latching circuit and multi-state information is continuously written into the memory cell until the contents of both match.

However, although this configuration offers high reliability since data is held digitally by the digital latching circuit, a special sense amp is required for reading the multi-state storage state and for generating digital output and consequently circuit configuration is complex. Moreover, since digital data comparison is carried out by a comparator the scale of the circuit is inevitably large.

SUMMARY OF THE INVENTION

It is therefore the object of the present invention to provide a memory device with a simplified circuit configuration and a small-scale circuit which maintains high reliability for holding data to be written into a non-volatile multi-state memory.

In order to achieve such objectives, a non-volatile multi-state memory device according to the present invention is characterized as follows.

The present invention is characterized in that it is provided with a data register for holding digital data to be inputted, a voltage generating circuit for generating a plurality of analog voltages, a decoder for decoding the data of the digital register and selectively outputting any one of the plurality of analog voltages in response to the data, a non-volatile mutli-state memory cell capable of writing multi-state analog amount, a comparator for comparing a voltage corresponding to an analog amount read out from the memory cell with an output voltage from the decoder, and a writing circuit for writing an analog amount into the memory cell in response to the comparison result of the comparator.

According to the present invention, circuit configuration can be simplified and circuit scale can be reduced without adversely affecting data holding reliability. The potential for circuit simplification is particularly significant since DA conversion processing in write mode and AD conversion processing in read mode can be implemented using the same circuit configuration.

Another aspect of the present invention is characterized in that it is provided with first and second memory cell arrays consisting of a plurality of non-volatile multi-state memory cells capable of storing multi-state analog amounts, first and second data register groups corresponding respectively to the first and second memory cell arrays, first and second reading circuit groups for reading analog amounts written into the first and second memory cell arrays and setting digital data corresponding to these analog amounts in the first and second data register groups respectively, first and second transmission circuit groups for transmitting digital data held in the first and second data register groups to an external portion and a control circuit for operating the first transmission circuit group to sequentially transmit the data held in the first data register group to an external portion, operating the second transmission circuit group after this transmission to sequentially transmit the data held in the second data register group to an external portion and for operating the second reading circuit while transmitting the data held in the first data register group to simultaneously read from a plurality of memory cells in the second memory cell array, and operating the first reading circuit while transmitting the data held in the second data register group data to simultaneously read from a plurality of memory cells in the first memory cell array.

The present invention is further characterized in that it is provided with first and second memory cell arrays consisting of a plurality of non-volatile multi-state memory cells capable of writing multi-state analog amounts, first and second data register groups consisting of a plurality of data registers for holding digital data, first and second writing circuit groups consisting of a plurality of writing circuits for respectively writing analog amounts corresponding to data held in the first and second data register groups in the first and second memory cell arrays and a control circuit for sequentially setting in the first data register group digital data inputted sequentially in a designated period and, after this setting, sequentially setting in the second data register group digital data inputted sequentially in a designated period, operating the second writing circuit group during the data setting period of the first data register group to simultaneously write to a plurality of memory cells of the second memory cell array and operating the first writing circuit group during the data setting period of the second data register group to simultaneously write to a plurality of memory cells of the first memory cell array.

The present invention is further characterized in that it is provided with n memory cell arrays consisting of a plurality of non-volatile multi-state memory cells capable of writing multi-state analog amounts, n data register groups respectively corresponding to the n memory cell arrays, n reading circuit groups for respectively reading analog amounts written in the n memory cell arrays and respectively setting digital data corresponding to each analog amount in the n data register groups, n transmission circuit groups for transmitting digital data held by the n data register groups to an external portion and a control circuit for operating the m th transmission circuit (m=1, 2, ..., n) to sequentially transmit the data held in the m th data register group to an external portion and, after this transmission, operating the (m+1)th transmission circuit group to sequentially transmit the data held in the (m+1)th data register group to an external portion and also operating the (m+1)th reading circuit to simultaneously read from a plurality of memory cells in the (m+1)th memory cell array, while transmitting the data held in the m th data register group.

The present invention is further characterized in that it is provided with n memory cell arrays consisting of a plurality of non-volatile memory cells capable of writing multi-state analog amounts, n data register groups consisting of a plurality of data registers for holding digital data, n writing circuit groups consisting of a plurality of writing circuits for respectively writing analog amounts corresponding to data held in the plurality of data register groups in the plurality of memory cell arrays and a control circuit for sequentially setting digital data sequentially inputted in a designated period in the m th data register group (m=1, 2, ..., n) and, after this setting, for sequentially setting in the (m+1)th data register group digital data inputted sequentially in a designated period, operating the m th writing circuit group during the data setting period of the (m+1)th data register group to simultaneously write to a plurality of memory cells of the m th memory cell array.

According to the present invention, the number of memory cells simultaneously carrying out writing can be greatly increased with no loss in data-holding reliability. It is also possible to transmit multi-state data which have been read without having to create vacant time even when the time taken to read multi-state data from a memory cell exceeds the transmission rate of the multi-state data which have been read. Unnecessary reading operations can thus be eliminated to a great extent.

Another aspect of the present invention further comprises an AD converter for sampling an input analog signal within a designated period of time and converting it to i bits of digital data (i=a whole number), j memory cell arrays (j=a whole number) formed from a plurality of the memory cells for respectively storing analog amount, and j writing circuits to which are inputted divided data from the i bits of digital data (i>j) outputted from the AD converter divided at every i/j bits, and for converting the respective divided data to corresponding analog amounts and respectively writing these amounts in the j memory cell arrays.

According to the present invention, a sampled analog signal is divided every i/j bits and stored in a plurality of memory cells. Consequently this reduces the effects of variation between memory cells while simplifying the writing circuit.

In addition, although an analog signal can be directly recorded in a memory cell, data-holding reliability is here improved by temporarily converting an analog signal to be inputted to a digital signal and digitally holding it in a data register.

BRIEF DESCRIPTION OF THE DRAWINGS

FIG. 10 is a diagram showing the relation between input digital data and corresponding analog voltage in an embodiment of the present invention.

FIG. 11 is a diagram showing a bias condition of a memory cell in an embodiment of the present invention.

DESCRIPTION OF THE PREFERRED EMBODIMENT

Figure 5:
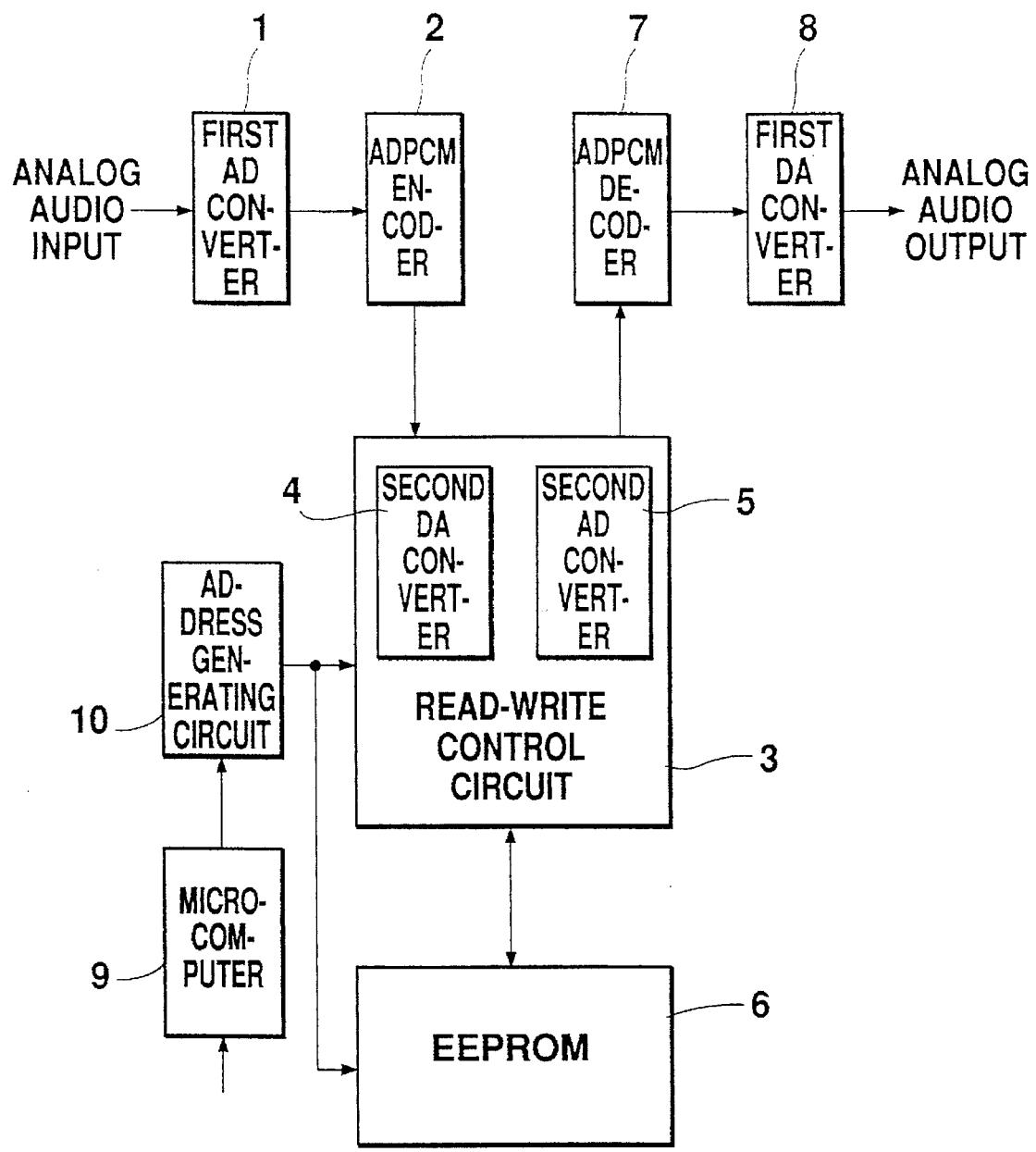
FIG. 5 is an overall diagram of an audio play apparatus implementing a configuration of the present invention.

FIG. 5 shows a summary block diagram of an audio play apparatus in which the present invention has been implemented.

In this apparatus, in record mode an analog audio signal to be inputted is converted by a first AD converter 1 to 12-bit digital audio data in a designated sampling period and then coded by an ADPCM encoder 2 to 4-bit digital compressed data and sent to a read-write control circuit 3. At the read-write control circuit 3, the 4-bit digital compressed data is converted to an analog signal by an internal second DA converter 4 and this analog signal is written in an EEPROM 6.

Alternatively, in play-back mode an analog signal is read from the EEPROM 6 by the read-write control circuit 3 and is converted to 4-bit digital compressed data at an internal second AD converter 5. This 4-bit digital compressed data is decoded by an ADPCM decoder 7 into 12-bit digital audio data and this 12-bit digital audio data is then converted to an analog signal by a first DA converter and outputted as audio sound from a speaker and the like not shown in the diagram.

Furthermore, 20-bit addresses data for writing and reading in EEPROM 6 are created by an address generating circuit 10 based on commands and the like inputted from a microcomputer 9 and supplied to the EEPROM 6 and the read-write control circuit 3.

Figure 1:
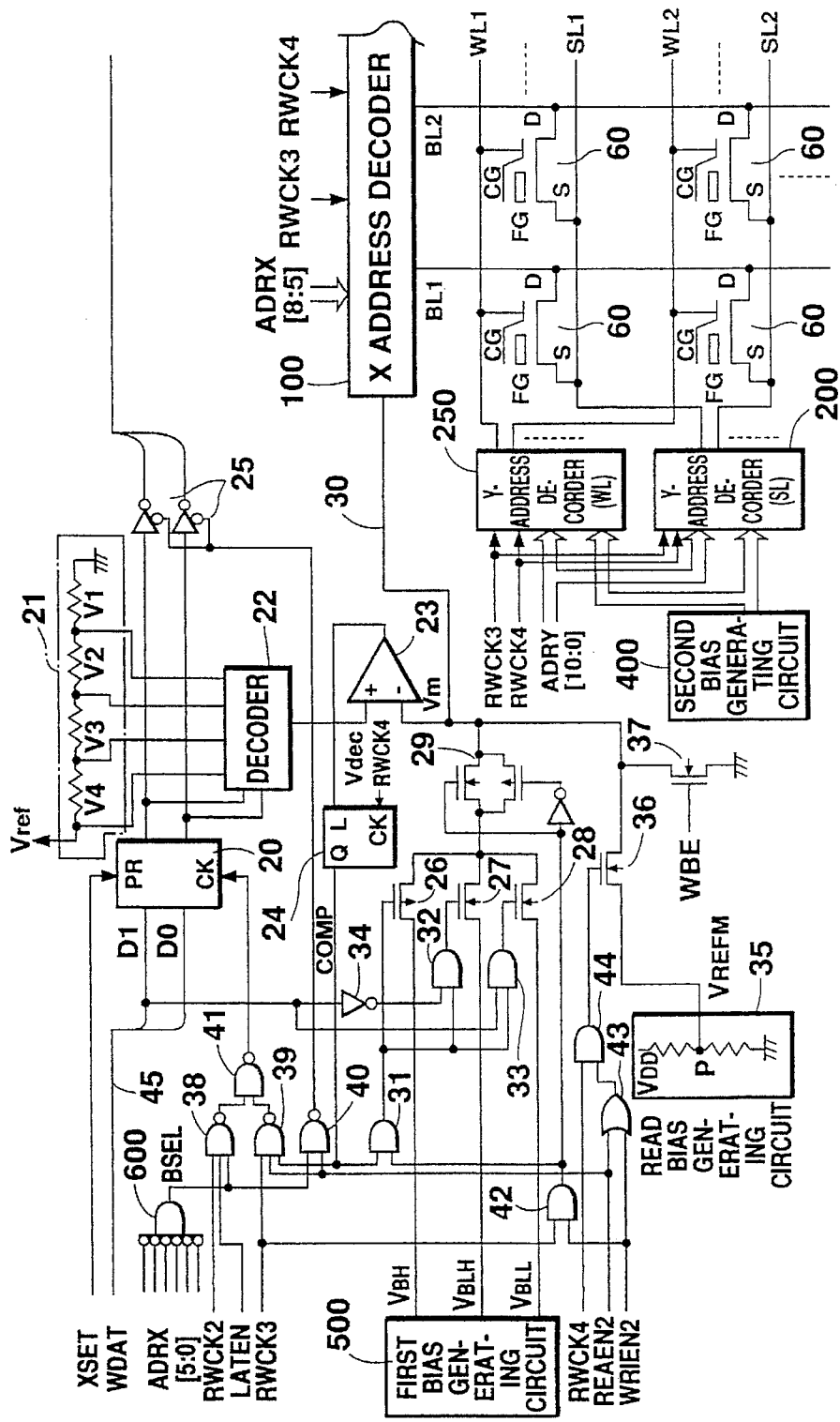
FIG. 1 is a circuit diagram showing a read-writing circuit in an embodiment of the present invention.

Next, an actual configuration of a read-writing circuit 300 included in the read-write control circuit 3 is shown in FIG. 1.

In FIG. 1, a data register 20 comprised from D flip-flops is a 2-bit data register for capturing and holding the upper or lower 2 bits of 4-bit digital compressed data outputted from an ADPCM encoder 2, a resistance dividing circuit 21 is a circuit for dividing reference voltage Vref into 4 voltages V1–V4 (V1<V2<V3<V4), a decoder 22 decodes the contents of data held in the data register 20 and selectively outputs one of the 4 voltages V1–V4 in accordance with those contents, a comparator 23 is provided an analog voltage Vdec outputted from the decoder 22 to a non-inverting terminal +and a voltage Vm read from the memory cell 60 of EEPROM 6 to an inverting terminal −, and compares both these voltages. While a timing clock RWCK 4 is at the H level, a latch circuit 24 outputs the output from the comparator 23 unaltered and when the clock RWCK 4 chages to the L level, the latch circuit 24 latches the output from the comparator 23 and outputs this latched output during the L level. In addition, an output buffer 25 is a buffer for outputting the content of data held in the data register 20, in other words it is a transmission circuit for transmitting digital data held in the data register 20 to an external portion, and the second DA converter 4 shown in FIG. 5 comprises the output buffer 25, a resistance dividing circuit 21 and a decoder 22.

Each memory cell 60 of the EEPROM 6 is a split gate-type cell with a floating gate FG and carries out writing by injecting electric charge to the floating gate FG and carries out erasure by extracting the electric charge injected to the floating gate FG. A drain D of each memory cell 60 is connected to a bit line BL1, BL2, . . . , a source S is connected to a source line SL1, SL2, . . . , a control gate CG is connected to a word line WL1, WL2, . . . An X address decoder 100 for decoding an upper 4-bit X address ADRX [8:5] selects one line from each bit line BL1, BL2, . . . and the selected line is connected to the inverting terminal of the comparator 23. The word lines WL1, WL2, . . . and source lines S1, S2, . . . are each connected respectively to Y address decoders 200 and 250 which decode an 11-bit Y address [10:0] and a bias voltage is supplied to these decoders 200, 250 from a second bias generating circuit 400. This bias voltage includes a high voltage bias Vhv 1 for writing and a high voltage bias Vhv 2 for erasing.

RWCK 3, RWCK 4 and WBE are inputted to the address decoders 100, 200, 250 as timing signals. Moreover, the terms "drain" and "source" used here refer essentially to the operation condition when reading is executed.

The 3 types of bias voltage VBH, VBLH, VBLL (VBH>VBLH>VBLL) supplied to bit lines B1, B2, . . . are outputted from first bias generating circuit 500 and a P channel MOS transistor 26, an N channel MOS transistor 27 and an N channel MOS transistor 28 are inserted respectively as switches at the supply lines for these bias voltages. An analog switch 29 which is switched on only when writing is executed is connected to the output side of these transistors and output from this analog switch 29 is connected to an input/output line 30 of the X address decoder 100. The COMP output of the latch circuit 24 is inputted at one input end of the AND gate 31. And the output of the AND gate 31 is applied to the gate of the P channel MOS transistor 26. The outputs of AND gates 32 and 33 are applied at the gates of N channel MOS transistors 27 and 28 respectively. The output of AND gate 31 is likewise inputted at one input end of AND gates 32 and 33, a signal consisting of the upper bit D1 of the data to be supplied to the data register 20 reversed by an invertor 34 is inputted at the other input end of AND gate 32 and the upper bit D1 of the data to be supplied to the data register 20 is inputted unchanged at the other input end of AND gate 33.

In addition, a read bias generating circuit 35 comprising a resistance dividing circuit is provided in order to read as a voltage the analog amount written in each memory cell 60 and the voltage division point P is connected to the input/output line 30 for the X address decoder 100 via the N channel MOS transistor 36 which is switched on only when the comparator 23 is executing comparison. An N channel MOS transistor 37 is inserted between the input/output line 30 and the ground in order to supply ground potentials when memory cell data are erased. This N channel MOS transistor 37 is activated by a control signal WBE and deems the bit lines B1, B2, . . . as ground potentials.

The read-writing circuit 300 shown in FIG. 1 organizes 8 memory cells into 1 block in the X address direction and each block is equipped with a block selector 600 in order to detect the fact that it has been selected. In block No. 0 shown in FIG. 1, the block selector 600 consists of an AND gate for detecting whether the lower 6-bit X address ADRX [5:0] is ALL 0.

Moreover in FIG. 1, a sampling clock RWCK 2 and a latch-enable signal LATEN and the block selector 600 output BSEL are inputted to NAND gate 38, a timing clock RWCK 3 and a read-enable signal REAN 2 and COMP output are inputted to NAND gate 39, the block selector 600 output BSEL and a read-enable signal REAEN 2 are inputted to NAND gate 40 and the output of both NAND gates 38 and 39 are inputted to NAND gate 41. The timing clock RWCK 3 and write enable signal WRIEN 2 are inputted to AND gate 42, a read-enable signal REAEN 2 and a write enable signal WRIEN 2 are inputted to OR gate 43, timing clock RWCK 4 and the output from OR gate 43 are inputted to AND gate 44. The output of NAND gate 41 is applied at a clock terminal CK of the D flip-flop consisting of a data register 20, the output of NAND gate 40 is applied as an ON/OFF control signal of an output buffer 25, the output of AND gate 42 is applied as an ON/OFF control signal of an analog switch 29, the output of AND gate 44 is applied to the gate of the N channel MOS transistor 36.

Figure 8:
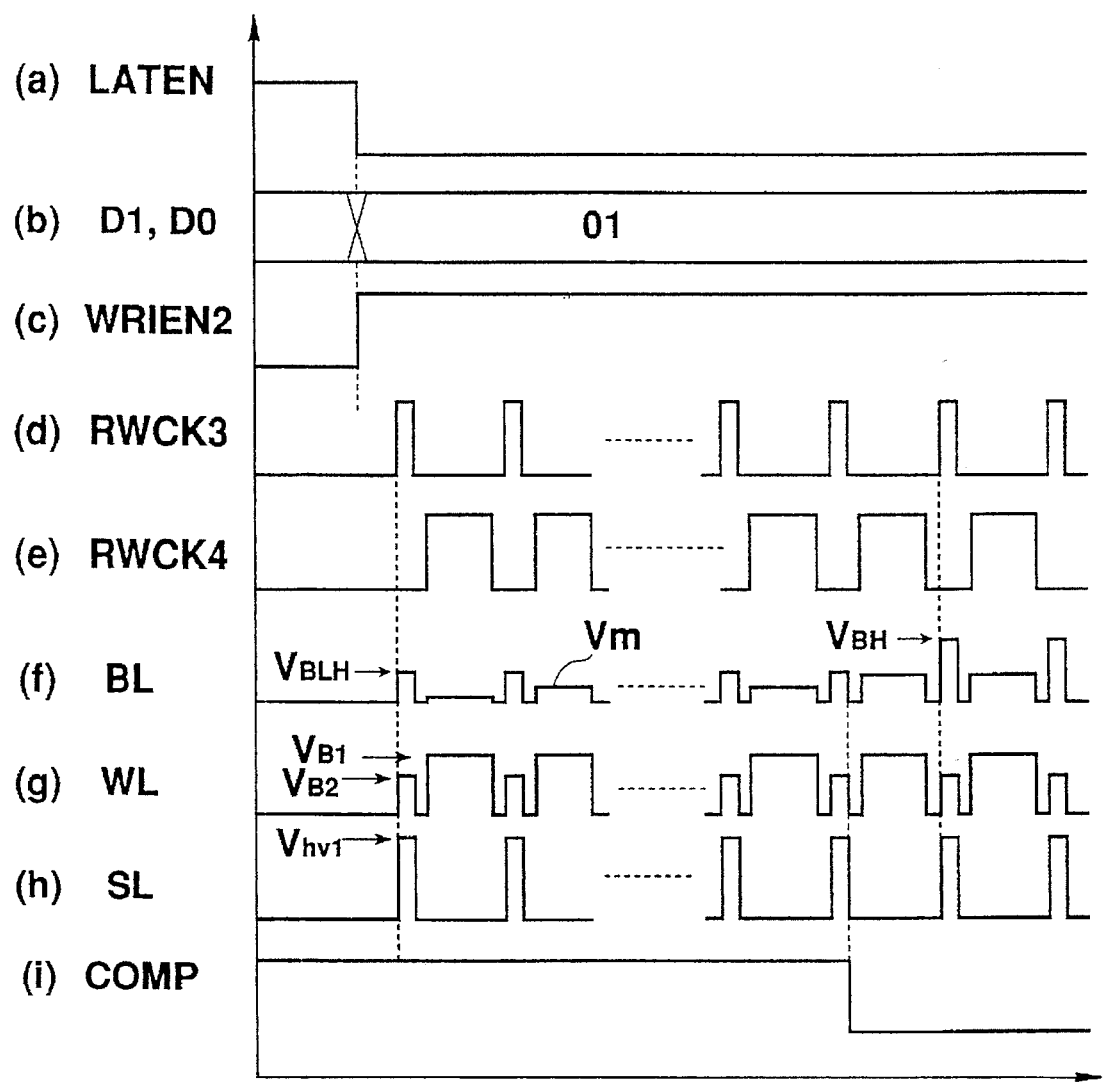
FIG. 8 is a timing chart depicting write mode operation of a read-writing circuit in an embodiment of the present invention.
Figure 9:
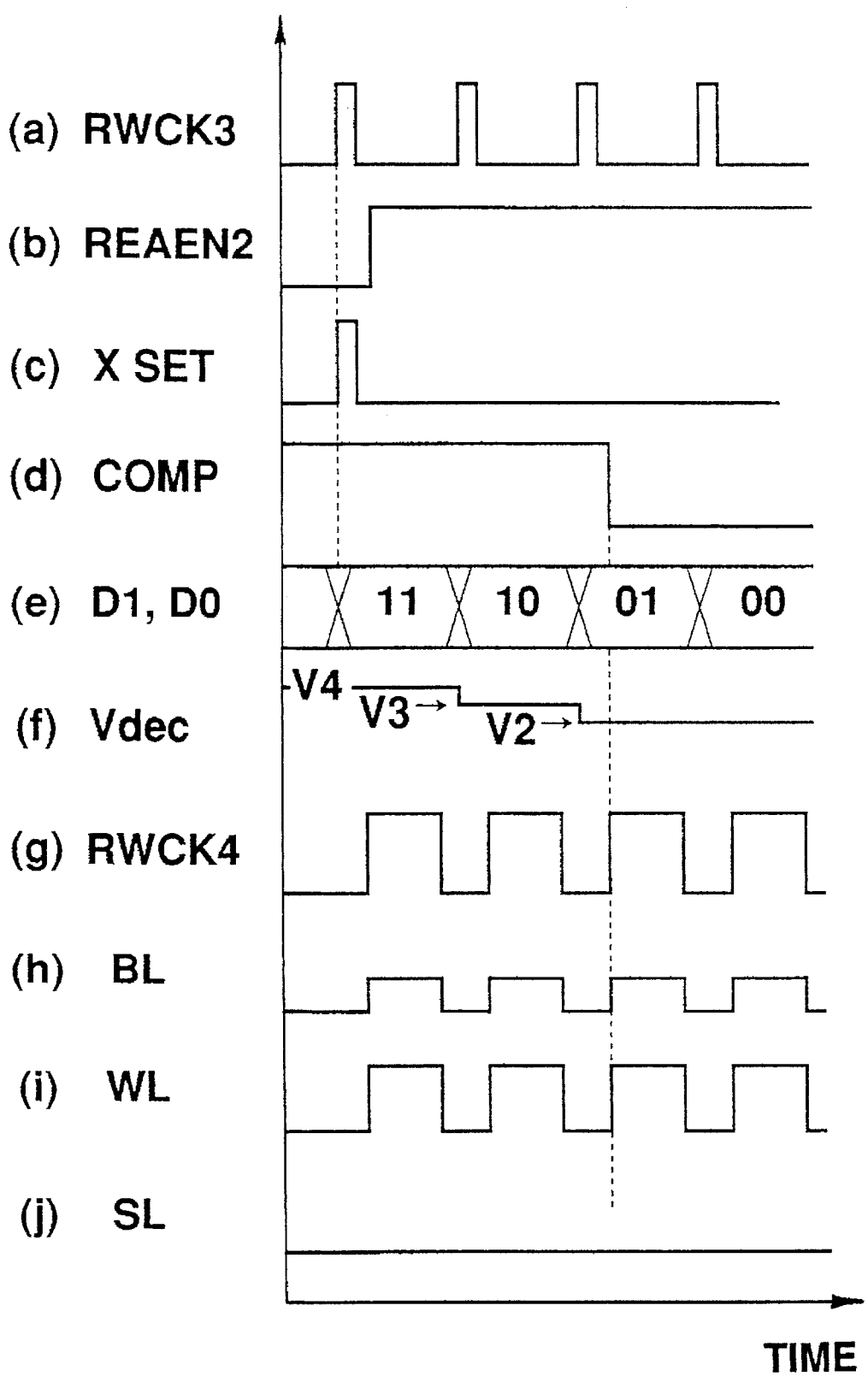
FIG. 9 is a timing chart depicting read mode operation of a read-writing circuit in an embodiment of the present invention.

The write operation and read operation of the read-writing circuit 300 will next be explained with reference to the timing chart shown in FIGS. 8 and 9. The bias conditions at each operation aspect of the memory cells 60 are as depicted in FIG. 11.

Prior to the writing operation, latch mode commences in order to latch the data in the data register 20. In latch mode, 2 bits of digital data D1 and D0 are sent to an input line 45, the EEPROM 6 addresses ADRX and ADRY at which the data are to be written are sent from the address generating circuit 10 shown in FIG. 5 and the signal LATEN which indicates latch mode rises to the H level. When the lower 6-bit ADRX [5:0] of the outputted X address matches its own block number, the block selector 600 output rises to the H level. In FIG. 1 for instance, the block selector 600 matches block No. 0, i.e. ADRX [5:0] is ALL 0 and outputs the H level. Consequently, the NAND gate 38 output at the start of the sampling pulse RWCK 2 change to the L level and then the NAND gate 41 output rises to the H level. Therefore, a clock is applied at the D flip-flop clock terminal CK consisting of a data register 20 and input data D1 and D0 are captured by the data register 20.

When capturing is completed, signal WBE rises to the H level, the N channel MOS transistor 37 turns to ON and the input/output line 30 has ground potential 0V. Since a bit line BL selected by the X address ADRX [8:5] is connected to the input/output line 30 at the X address decoder 100, that bit line BL also becomes 0V. In addition, since a high voltage bias Vhv 2 for erasure is applied at the selected word line WL by the Y address decoder 250 and 0V from the Y address decoder address decoder 200 is applied at the source line SL, the selected memory cell is thus erased. In other words, the electric charge to the floating gate FG of the memory cell 60 is extracted.

Once erasure is completed, the operation enters the actual write mode.

In write mode, the signal WRIEN 2 rises to the H level as shown in FIG. 8(c) and consequently while the clock RWCK 3 is at the H level as in FIG. 8(d) the output of the AND gate 42 rises to the H level. Moreover, since the latch circuit 24 has been set initially at the H level the output of the AND gate 31 also rises to the H level. Therefore, the analog switch 29 is now ON and the P channel MOS transistor 26 is OFF.

If the upper bit D1 of the input data is now "0" the AND gate 32 output rises to the H level and therefore the N channel MOS transistor 27 switches ON and the bias voltage VBLH is supplied to the selected bit line BL via the analog switch 29, the input/output line 30 and the X address decoder 100 as shown in FIG. 8(f). Alternatively, if the upper bit D1 of the input data is "1", the AND gate 33 output rises to the H level and therefore the N channel MOS transistor 28 switches ON and the bias voltage VBLL is supplied to the selected bit line BL via the analog switch 29, the input/output line 30 and the X address decoder 100.

While the clock RWCK 3 is at the H level, since high voltage Vhv 1 is supplied to the source line SL selected by the Y address decoder 200 (FIG. 8(h)) and VB2 is supplied to the word line WL selected by the Y address decoder 250 (FIG. 8(g)), the writing conditions shown in FIG. 11 are therefore satisfied and writing is executed in the memory cell 60. In other words, charge injection to the floating gate FG of the memory cell 60 commences.

Next, the clock RWCK 3 changes to the L level and when clock RWCK 4 rises to the H level as shown in FIG. 8(e), since the AND gate 42 output changes to the L level and the AND gate 44 output rises to the H level, the analog switch 29 switches to OFF, the N channel MOS transistor 36 turns to ON and the voltage division point P on the read bias generating circuit 35 is connected to the input/output line 30. The potential of the voltage division point P is set at a voltage VREFM slightly higher than V4 when the N channel MOS transistor 36 is OFF. Moreover, in this state, since VB1 is applied to a selected word line WL by the Y address decoder 250 and 0V is applied to the source line SL by the Y address decoder 200, the selected memory cell 60 is now in the reading state. Thus a voltage Vm corresponding to the charge injected at the floating gate FG of the memory cell 60 is obtained at the input/output line 30 and the comparator 23 then compares this voltage Vm with the voltage Vdec outputted from the decoder 22.

In response to data latched by the data register 20, the decoder 22 selects an analog voltage of one the 4 voltages V1–V4 from the resistance dividing circuit 21 and outputs this to the non-inverting terminal of the comparator 23. The relation here between the data D1, D0 and the voltage division values V1–V4 is shown in FIG. 10.

If the comparison shows that Vdec>Vm, the output of the comparator 23 remains at the H level and the writing operation based on the clock RWCK 3, the reading operation based on the clock RWCK 4 and the comparing operation described above are repeated. By repeating the writing operation, the amount of charge injected to the floating gate FG increases and the reading voltage Vm rises as shown in FIG. 8(f). When Vdec≦Vm, the output of the comparator 23 and the output COMP of the latch circuit 24 both reverse to the L level. Consequently, the output of the AND gate 31 reverses from the H level to the L level, the P channel MOS transistor 26 switches to ON, the output of AND gates 32, 33 changes to the L level and both N channel MOS transistors 27, 28 switch to OFF. As a result, when the clock RWCK 3 has reached the H level, the bias voltage VBH is supplied to the bit line BL of the memory cell via the analog switch 29 (see FIG. 8(f)). In other words, the write bias conditions depicted in FIG. 11 break down and the writing operation is terminated.

As described above, in write mode any one of 4 analog amounts corresponding to 2-bit inputted digital data are stored at a selected memory cell 60.

Figure 12:
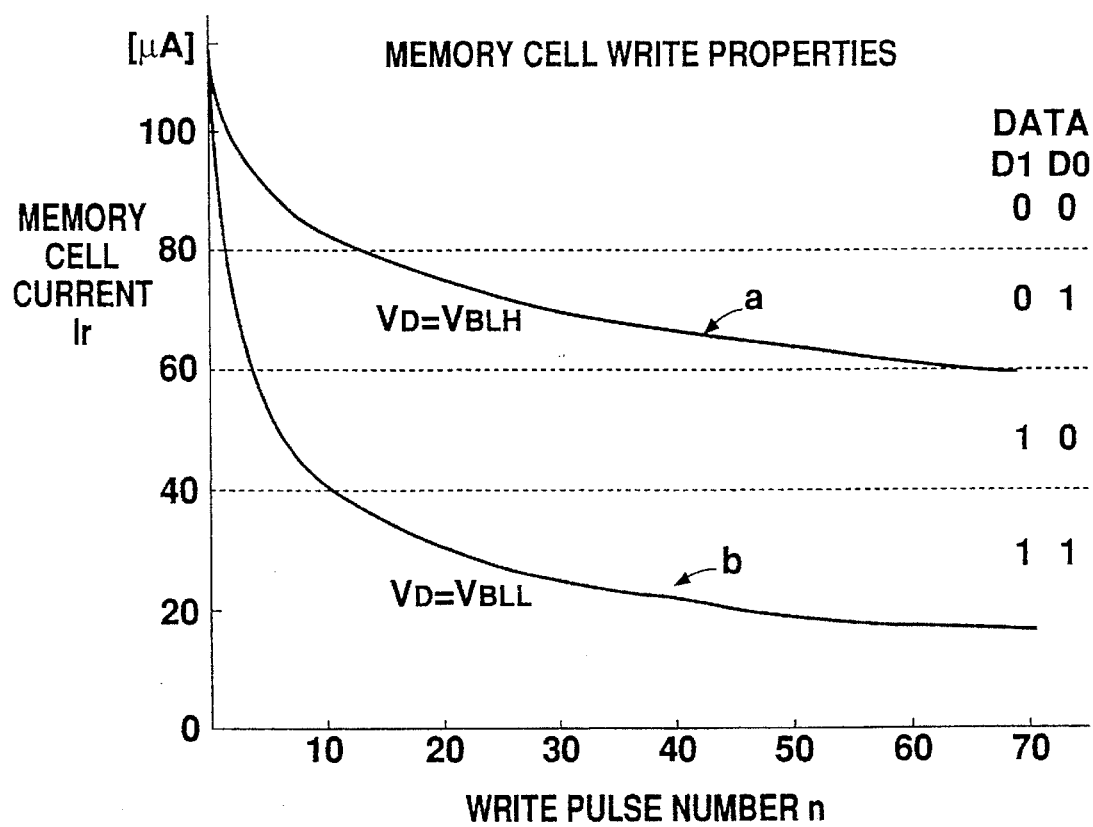
FIG. 12 is diagram showing writing characteristics of a memory cell in an embodiment of the present invention.

FIG. 12 shows the relation between the abovementioned write pulse number n during writing operation and the memory cell current Ir, in which curve a indicates a case in which bias voltage VBLH has been applied to the drain and curve b indicates a case in which bias voltage VBLL has been applied to the drain.

When the write pulse number n increases, since the amount of charge injected to the floating gate increases and the memory cell threshold voltage Vt increases, the memory cell current Ir decreases. However, since the amount of charge injected to the floating gate per pulse gradually decreases, the memory cell current decrease rate is also gradually reduced.

As curve [a] shows, when the comparatively high voltage VBLH is used as the bias voltage to be applied to the drain, the memory cell current value corresponding to data "0, 1" is 80 μA when approximately 15 pulses are applied and a read voltage of about V2 is obtained when reading is executed, but a write pulse of over 60 pulses has to be applied in order to obtain a memory cell current value 60 μA (this being the current value which corresponds to read voltage V3) corresponding to data "1, 0".

Therefore, according to the circuit configuration shown in FIG. 1, since the bias voltage applied to the drain is switched from VBLH to the lower VBLL when the upper data bit D1 is "1" the amount of charge injected to the floating gate per pulse increases. Consequently, as curve [b] shows, a memory cell current value 60 μA corresponding to data "1, 0" is thus obtained with approximately 4 pulses and a memory cell current value 40 μA (this being the current value which corresponds to read voltage V4) corresponding to data "1, 1" is obtained with approximately 11 pulses.

In other words, writing can be carried out in a shorter time period by switching the bias voltage value supplied to the drain in accordance with the data to be written.

Operation in read mode will next be explained with reference to FIG. 9.

In read mode, when signal XSET (FIG. 9(c)) rises to the H level, an initial value of ALL "1" is set in the data register 20 (FIG. 9(e)) and an analog voltage V4 corresponding to ALL "1" is outputted from the decoder 22 as shown in FIG. 9(f). When the clock RWCK 4 then rises to the H level as shown in FIG. 9(g), since the bias conditions for the memory cell 60 are exactly the same as those in when executing read operation in write mode, the inverting terminal of the comparator 23 obtains a voltage Vm corresponding to the charge injected at the floating gate of the selected memory cell and compares this voltage Vm with the voltage V4 outputted from the decoder 22. If this comparison shows that Vm>V4, the comparator 23 and the latch circuit 24 output COMP change to the L level and therefore the output of the NAND gate 39 rises to the H level. Since the output of the NAND gate 38 is fixed at the H level in this time, the output of the NAND gate 41 now changes to the L level and the ALL "1" value thus remains held in the data register 20 without any subsequent latching.

Alternatively, if the result of the comparison is that Vm≦V4, the comparator 23 and the latch circuit 24 output COMP change to the H level and therefore when the clock RWCK 3 rises to the H level as FIG. 9(a) shows, the output of the NAND gate 39 changes to the L level. Consequently, the NAND gate 41 outputs a clock signal to the data register 20 and the data register 20 latches the data supplied by the data input line 45. During read mode, since data "D1, D0" at "10", "01" and "00" are outputted sequentially from the down counter 801 shown in FIG. 2 on this data input line 45 each time the clock RWCK 4 changes to L level, after data "11" the data register 20 latches data "10" as shown in FIG. 9(e). When the decoder 22 output Vdec then decreases to voltage 3 as shown in FIG. 9(f) and the clock RWCK 4 reverts to the H level, the comparator 23 compares the voltage V3 with the voltage Vm corresponding to the analog amount read from the memory cell. If Vm>V3, the comparator 23 and the latch circuit 24 output COMP reverse to the L level and "10" is thus held in the data register 20 without any subsequent latching. If the comparison result shows that Vm≦V3, the comparator 23 and the latch circuit 24 output COMP remain at the H level and therefore the data register 20 latches the next data "01" and the comparator 23 compares V2 with Vm. If this comparison shows that Vm>V2, the data register 20 content is fixed at "01" but if Vm≦V2 the data register 20 latches the final data "00" and the comparator 23 compares Vm and V1. Since voltage V1 is set a approximately 0V, the final comparison shows that Vm>V1 and the content of the data register 20 is fixed at "00".

As the above description shows, a voltage Vm corresponding to an analog amount read from a memory cell is AD converted by a data register 20, a resistance dividing circuit 21, a decoder 22, a comparator 23, a NAND gate 39 and a NAND gate 41 and is then sent to an external portion through an output buffer 25. In other words, these are the circuits which comprise the second AD converter 5 depicted in FIG. 5.

In the read-writing circuit 300 described above, 2-bit digital data were converted to 4 analog amounts and any one of 4 analog amounts is written in a single memory cell. In fact, however, the ADPCM converter 2 outputs 4-bit digital data.

Figure 2:
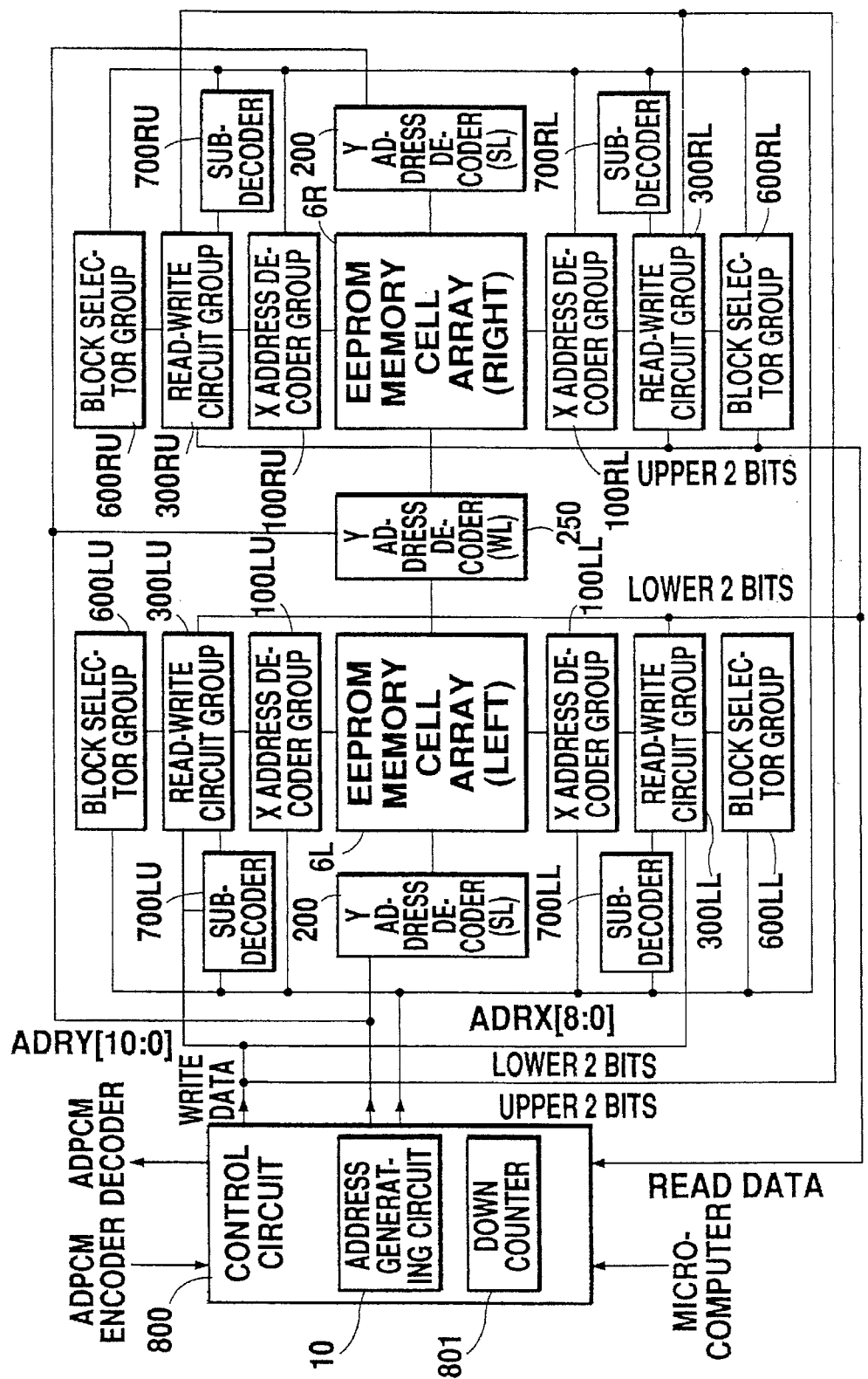
FIG. 2 is a block diagram depicting a pair of left-right memory cell arrays and their peripheral circuits in an embodiment of the present invention.

Therefore in this example, the upper 2 bits (i/j bits) of the 4-bit (i-bit; i>j; j=the number of the memory cell array) digital data are stored in the right memory cell array 6R and the lower 2 bits (i/j bits) are stored in the left memory cell array 6L as shown in FIG. 2. The storing operation for both these arrays is of course carried out by the abovementioned read-writing circuit 300 shown in FIG. 1. After the 2 bits of digital data have been converted to 4 analog amounts these are stored respectively in multi-state memory cells.

In FIG. 2, 800 is a control circuit connected to a microcomputer 9, an ADPCM encoder 2 and an ADPCM decoder 7. This control circuit 800 includes a down counter 801 for outputting a down count value for AD conversion when executing reading and an address generating circuit 10. In addition to transmitting a 9-bit X address ADRX, an 11-bit Y address decoder address ADRY and 4-bit data, the control circuit 800 outputs all the clock signals and control signals shown in FIG. 1, and also temporarily captures digital data corresponding to analog amounts read from memory cells and sends them to the ADPCM decoder 7.

Moreover, the upper side of the right memory cell array 6R is equipped with a block selector group 600 RU, a read-writing circuit group 300 RU, an X address decoder 100 RU and a subdecoder 700 RU. Symmetric with these, the lower side of the memory cell array 6R is also equipped with a block selector group 600 RL, a read-writing circuit group 300 RL, an X address decoder group 100 RL and a subdecoder 700 RL. The left memory cell array 6L is equipped identically to the right memory cell array. Above it are a block selector group 600 LU, a read-writing circuit group 300 LU, an X address decoder group 100 LU, a subdecoder 700 LU and below it are a block selector group 600 LL, a read-writing circuit group 300 LL, an X address decoder group 100 LL and a subdecoder 700 LL.

The abovementioned circuit configurations corresponding to the right memory cell array 6R and the left memory cell array 6L are entirely identical. Moreover, since the inputted address signals are also identical, these memory cells operate in exactly the same way. The configuration of the Y address decoders 200 and 250 is identical to that shown in FIG. 1. A second bias generating circuit 400 (not shown in FIG. 2) identical to that shown in FIG. 1 is also provided for supplying bias voltages such as Vhv1, Vhv2 to the decoders 200 and 250. The left memory cell array 6L and the surrounding circuits will next be explained with reference to FIG. 3.

Figure 3:
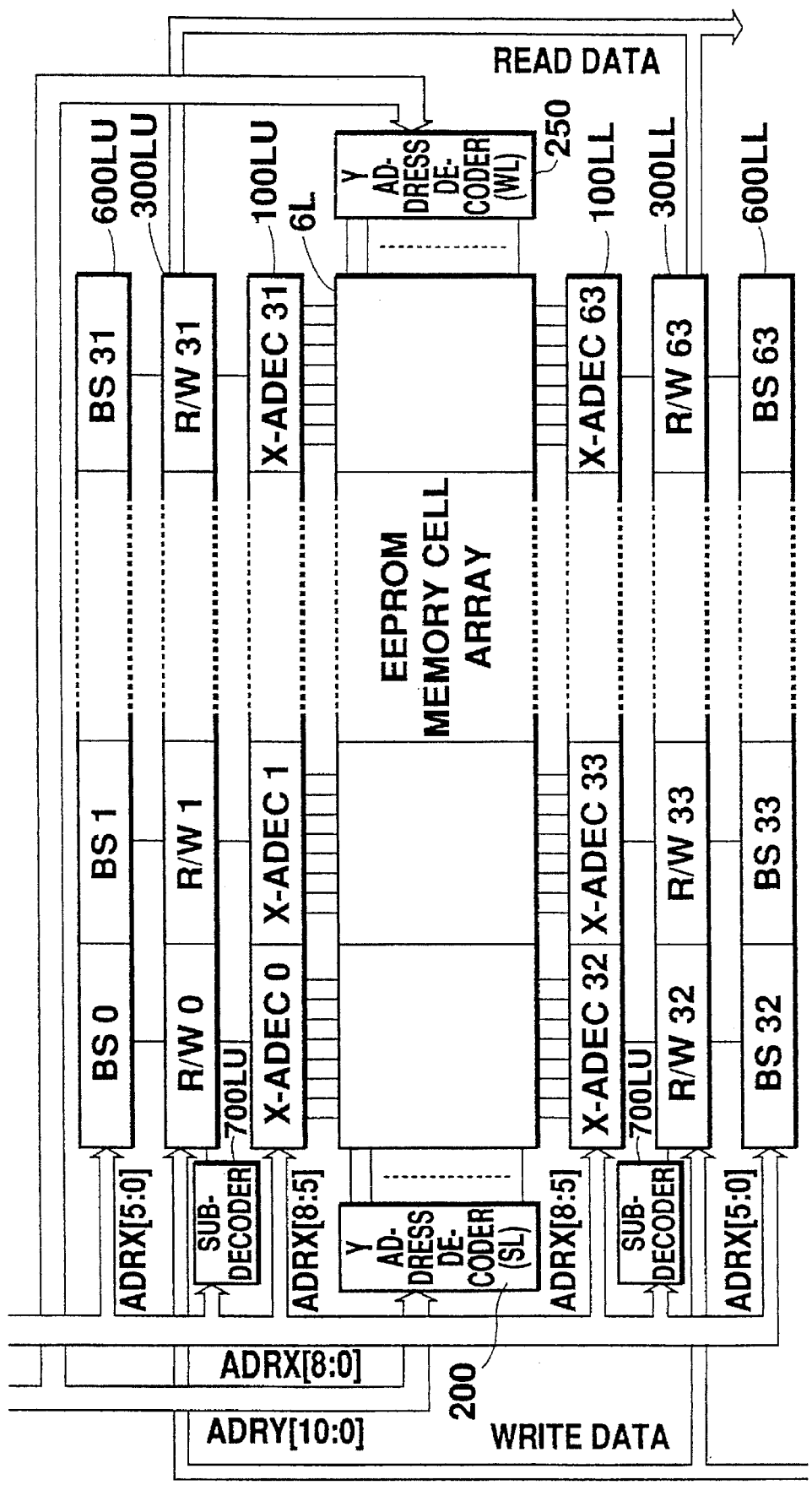
FIG. 3 is a block diagram depicting a left memory cell array and its surrounding circuits in an embodiment of the present invention.

The memory cell array 6L in FIG. 3 is split-managed by 32 blocks above and below it and each of these blocks is equipped with a block selector BS, a read-writing circuit R/W and an X address decoder X-ADEC. Thus block selector groups 600LU and 600LL each consist of 32 block selectors BS, read-writing circuit groups 300LU and 300LL each consist of 32 read-writing circuits R/W and X address decoder groups 100LU and 100LL each consist of 32 X address decoders X-ADEC. The read-writing circuits R/W of all the blocks in FIG. 3 have exactly the same configuration as the read-writing circuit 300 shown in FIG. 1 and the X address decoders X-ADEC are also configured identically to the X address decoder 100 shown in FIG. 1. However, since each block selector BS detects the selection of its own block, a different address is inputted to each block to ensure that H level is outputted only when an X address ADRX [5:0] indicating that block selector's own block No. has been inputted.

Figure 6:
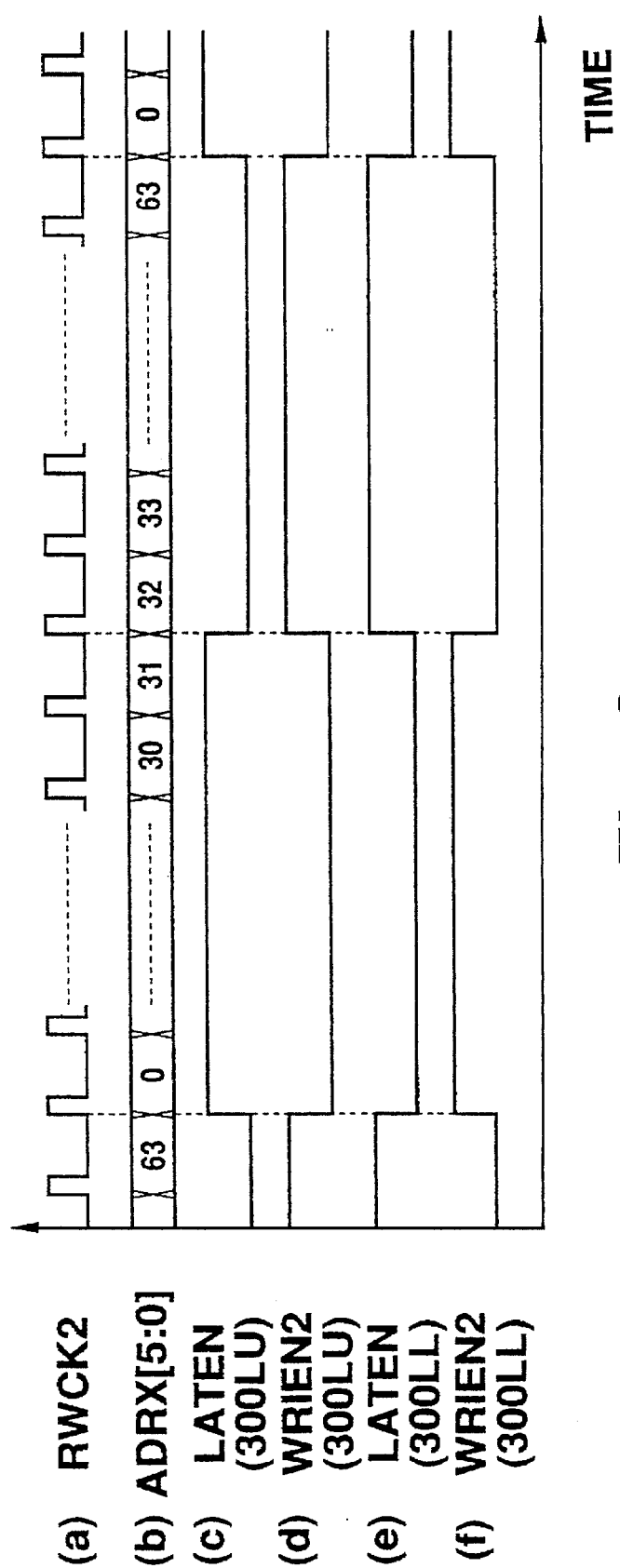
FIG. 6 is a timing chart depicting latch mode and write mode operation of a read-writing circuit group in an embodiment of the present invention.

Operation in data write mode will now be explained with reference to FIG. 6.

Since addresses sent from the address generating circuit 10 shown in FIG. 2 are sequentially updated, the lower 6-bit address X address ADRX [5:0] first changes as shown in FIG. 6(b) and in compliance with the change in this X address ADRX [5:0], all the select outputs BSEL of all the block selectors BS0–BS31 from block No. 0 to block No. 31 in the upper block selector group 600LU change sequentially to the H level. During this period, the latch-enable signal LATEN and write-enable signal WRIEN 2 supplied to the upper read-writing circuit group 300LU change respectively to the H level and the L level as shown in FIG. 6(c) (d), and therefore the sampled data are latched sequentially by each data register 20 within each corresponding read-writing circuit R/W from block No. 0 to block No. 31. Moreover, X address ADRX [5:0] is updated as FIG. 6(b) shows and in compliance therewith, all the select outputs BSEL of all the block selectors BS32–BS63 from block No. 32 to block No. 63 in the lower block selector group 600LL change sequentially to the H level. Since the latch-enable signal LATEN rises to the H level during this period as shown in FIG. 6(e), the sampled data are latched sequentially by the data register 20 within each corresponding read-writing circuit R/W from block No. 32 to block No. 63 in the lower read-writing circuit group 300LL. In addition, since the write-enable signal WRITEN 2 supplied to the upper read-writing circuit group 300LU simultaneously rises to the H level during this period as shown in FIG. 6(d), all blocks Nos. 0–31 execute writing simultaneously. However, since at each block the X address decoder X-ADEC selects one bit line BL based on the upper 8-bit X address ADRX [8:5] supplied to this X address decoder X-ADEC and the Y address decoders 200 and 250 respectively select one source line source line SL and one word line WL, writing is resultantly executed simultaneously in the selected upper 32 memory cells.

After writing has been executed, address ADRX [5:0] reverts to "0" and is again sequentially updated and thus the data registers 20 of each block in the upper read-writing circuit group 300LU sequentially latch the 32 sampling data which are to be inputted next. Since the write-enable signal WRITEN 2 supplied to the lower read-writing circuit group 300LL rises to the H level while this latching operation is being carried out, writing is executed simultaneously in the 32 selected memory cells of all the lower blocks Nos. 32–63.

The upper read-writing circuit 300LU (the number m; m=1 in this embodiment) and the lower read-writing circuit 300LL (the number m+1) thus carry out the data latching and writing operations alternately. Therefore, even if the writing time exceeds the time taken for 1 sampling, writing can be effectively executed without the need to create vacant time.

Figure 7:
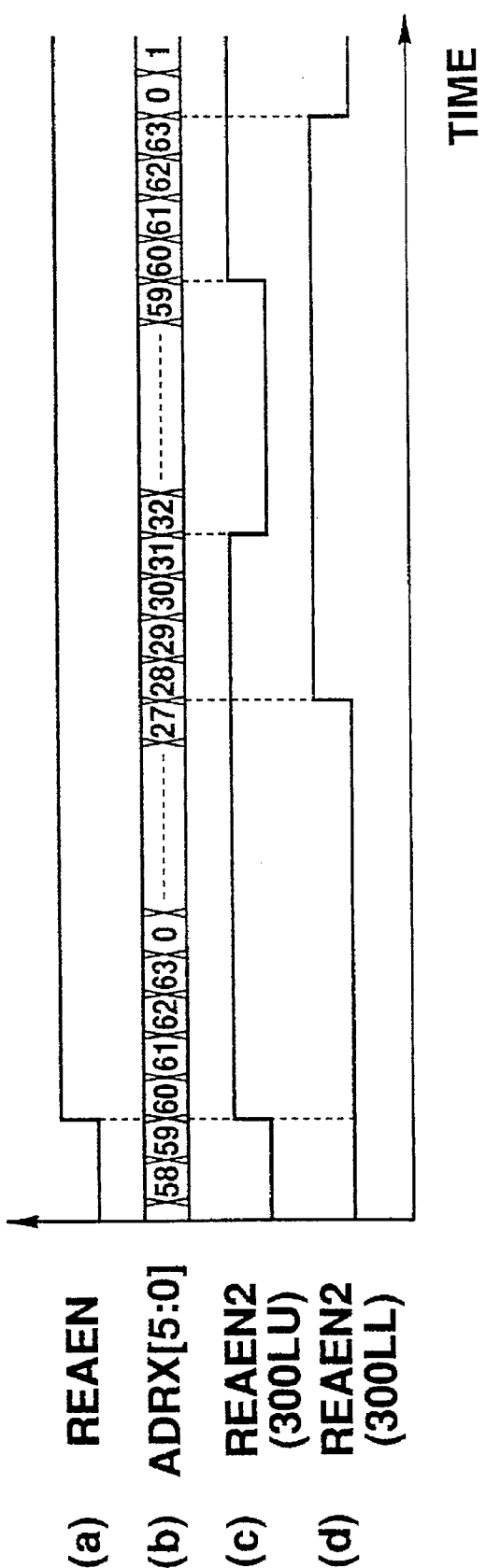
FIG. 7 is a timing chart depicting read mode operation of a read-writing circuit group in an embodiment of the present invention.

Read mode operation will next be explained with reference to FIG. 7.

Figure 4:
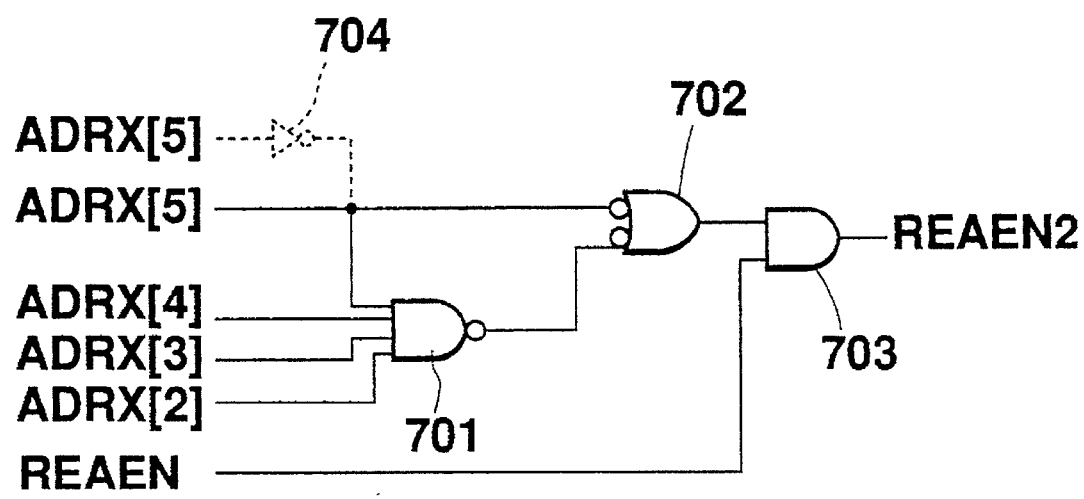
FIG. 4 is a diagram showing a detailed example of a configuration of a subdecoder in an embodiment of the present invention.

As indicated by the solid lines in FIG. 4, a subdecoder 700LU consists of a NAND gate 701 for inputting an X address ADRX [5:2], a NAND gate 702 which inputs an address ADRX [5] and the output from NAND gate 701 and an AND gate 703. The AND gate 703 is inputted a signal REAEN which is already at the H level during read mode and the output from NAND gate 702 and outputs them as the read-enable signal REAEN2 shown in FIG. 1. In addition, a subdecoder 700LL has a configuration identical to that of the subdecoder 700LU with the exception that instead of the address ADRX [5] it inputs the reverse signal of this address as indicated by the dotted line in FIG. 4.

In read mode, the address ADRX [5:0] is updated as shown in FIG. 7(b) and when the address reaches "60" the entire bit output of ADRX [5:2] rises to the H level, the output of the NAND gate 701 at the subdecoder 700LU thus changes to the L level and consequently the output of NAND gate 702 changes to the H level. As a result, the AND gate 703 output REAEN2 rises to the H level as shown in FIG. 7(c). Therefore, reading of data from 32 memory cells Nos. 0–31 commences simultaneously at the upper read-writing circuit group 700LU. This reading operation is longer than 1 sampling period (period in which an address is updated only one state), in this case lasting for approximately 3 sampling periods, and the operation ceases until the address returns to "0".

The period which the output of the NAND gate 701 is at the H level, continues from the address "60" until reaching the address "63" and the output changes to the L level when the address returns to "0". However, since ADRX [5] is already at the L level while the address is between "0" and "31", the output of NAND gate 702 rises to the H level and the subdecoder 700LU output REAEN2 continues to maintain H level output as shown in FIG. 7(c). When ADRX [5:0] changes from "0" to "31", block selectors BS of blocks Nos. 0 to 31 sequentially output H level. Consequently, an output buffer 25 (see FIG. 1) comprising a transmission circuit opens in each of the corresponding read-writing circuits R/W and the contents of data register 20 are sequentially outputted.

Alternatively, at the subdecoder 700LL when address ADRX [5:0] reaches "28", the reverse output of address ADRX [5] and each bit output of ADRX [4:2] all change to the H level and thus the NAND gate 701 output also rises to the H level. As a result, the output of the NAND gate 702 rises to the H level and consequently the AND gate 703 output REAEN2 rises to the H level as shown in FIG. 7(d). Therefore, reading of data from 32 memory cells commences simultaneously at the lower read-writing circuit group 300LL. The output of NAND gate 701 then maintains the H level up until the address reaches "31" and changes to the L level when the address reaches "32". Since the reverse output of ADRX [5] is already at the L level while the address is between "32" and "63", the lower read-writing circuit group 300LL output REAEN2 continues to maintain H level output as shown in FIG. 7(d). While the address is changing from "32" to "63", block selectors BS of blocks Nos. 32 to 63 sequentially output the H level. Consequently, an output buffer 25 (see FIG. 1) comprising a transmission circuit opens in each of the respective corresponding read-writing circuits R/W and the contents of data register 20 are sequentially outputted.

The abovementioned subdecoders 700LU and 700LL form one part of a control circuit which together with a control circuit 800 and the like controls reading of upper and lower data of the memory cell array 6L. The subdecoder 700LL comprises a detecting circuit for detecting the specification of one of the data register (block No. 28) of the read-writing circuit group 300LU while a transmission circuit group consisting of an output buffer installed within the read-writing circuit 300LU is transmitting the upper data of memory cell array 6L. Furthermore, subdecoder 700LU comprises a detecting circuit for detecting the specification of one of the data register (block No. 60) of the read-writing circuit group 300LL while a transmission circuit group consisting of an output buffer installed within the read-writing circuit 300LL is transmitting the lower data of memory cell array 6L.

Reading of the upper side of memory cell array 6L commences in response to change to the H level of a read-enable signal REAEN2 sent from the subdecoder 700LU (see FIG. 7(c)) and reading of the lower side of memory cell array 6L commences in response to change to the H level of a read-enable signal REAEN2 sent from the subdecoder 700LL (see FIG. 7(d)).

Thus unneeded vacant periods during read mode can be prevented by reading the contents of the data register 20 four sampling periods prior to commencing data output.

The above description related to the left memory cell array 6L shown in FIG. 2 based on FIG. 3, but the same operation is also carried out at the right-side memory cell array 6R as explained above.

While there has been described what is at present considered to be a preferred embodiment of the invention, it will be understood that various modifications may be made to the present invention and it is intended that the appended claims cover all such modifications as fall within the true spirit and scope of the invention.

What is claimed is:

1. A non-volatile multi-state memory device, wherein said memory device comprises a data register for holding digital data to be inputted;

a voltage generating circuit for generating a plurality of analog voltages;

a decoder for decoding the data held in the digital register and selectively outputting one of the plurality of analog voltages in response to the data;

a non-volatile multi-state memory cell capable of storing multi-state analog amount;

a comparator for comparing a voltage corresponding to an analog amount read from the memory cell with an output voltage from the decoder; and a writing circuit for writing an analog amount into the memory cell in response to the comparison result of the comparator.

2. A non-volatile multi-state memory device according to claim 1, further comprising a controlling circuit, wherein in write mode, the control circuit sets data to be written into the memory cell in the data register, activates the writing circuit to write into the memory cell an analog amount corresponding to data set in the data register; and in read mode, the control circuit sequentially sets in the data register digital data updated in sequence from a designated value and at each respective setting operates the comparator to execute comparison, terminates setting of the digital data in the data register in response to the comparison result and obtains the digital data corresponding to an analog amount read from the memory cell from the data register.

3. A non-volatile multi-state memory device according to claim 1, wherein the voltage generating circuit consists of a resistance dividing circuit.

4. A non-volatile multi-state memory device comprising first and second memory cell arrays consisting of a plurality of non-volatile multi-state memory cells capable of storing multi-state analog amounts;

first and second data register groups corresponding respectively to the first and second memory cell arrays;

first and second reading circuit groups for reading analog amounts written in the first and second memory cell arrays and respectively setting digital data corresponding to the analog amounts in the first and second data register groups;

first and second transmission circuit groups for transmitting digital data held in the first and second data register groups to an external portion; and a control circuit for operating the first transmission circuit group to sequentially transmit the data held in the first data register group to an external portion, operating the second transmission circuit group after transmission from the first transmission circuit group to sequentially transmit the data held in the second data register group to an external portion and also for operating the second reading circuit while transmitting the data held in the first data register group to simultaneously read from a plurality of memory cells in the second memory cell array, operating the first reading circuit while transmitting the data held in the second data register group to simultaneously read from a plurality of memory cells in the first memory cell array.

5. A non-volatile multi-state memory device according to claim 4, wherein reading circuits of the first and second reading circuit groups each comprise a voltage generating circuit for generating a plurality of analog voltages;

a decoder for decoding the data from one corresponding data register of the first and second data register groups and selectively outputting any one of the plurality of analog voltages in accordance with the data; and a comparator for comparing a voltage corresponding to an analog amount read from one of the corresponding memory cells of the first and second memory cell arrays with an output voltage of the decoder; and wherein the reading circuits sequentially set digital data in the data register to be updated in sequence from a designated value and at each respective setting operate the comparator to execute comparison, terminate setting of the digital data in the data register in response to the comparison result and obtain the digital data corresponding to an analog amount read from the memory cell from the data register.

6. A non-volatile multi-state memory device according to claim 4, wherein the control circuit includes a first detecting circuit for detecting specification of a specific data register of the first data register group during transmission by the first transmission circuit group;

a second detecting circuit for detecting specification of a specific data register of the second data register group during transmission by the second transmission circuit group; and wherein the control circuit controls to read from a second memory cell array in response to the output of the first detecting circuit and controls to read from a first memory cell array in response to the output of the second detecting circuit.

7. A non-volatile multi-state memory device, wherein said device comprises first and second memory cell arrays consisting of a plurality of non-volatile multi-state memory cells capable of storing multi-state analog amounts;

first and second data register groups consisting of a plurality of data registers for holding digital data;

first and second writing circuit groups consisting of a plurality of writing circuits for respectively writing, into the first and second memory cell arrays, analog amounts corresponding to data held in the first and second data register groups; and a control circuit for sequentially setting, in the first data register group, digital data inputted sequentially in a designated period and, after this setting, sequentially setting, in the second data register group, digital data inputted sequentially in a designated period, and also for operating the second writing circuit group during the data setting period of the first data register group to simultaneously write to a plurality of memory cells of the second memory cell array, operating the first writing circuit group during the data setting period of the second data register group to simultaneously write to a plurality of memory cells of the first memory cell array.

8. A non-volatile multi-state memory device according to claim 7, wherein writing circuits of the first and second writing circuit groups each comprise a voltage generating circuit for generating a plurality of analog voltages;

a decoder for decoding the data from one corresponding data register of the first and second data register groups and selectively outputting any one of the plurality of analog voltages in accordance with the data; and a comparator for comparing a voltage corresponding to an analog amount read from one of the corresponding memory cells of the first and second memory cell arrays with an output voltage of the decoder; and a writing control circuit for writing an analog amount into the memory cell in response to the respective result of the comparator.

9. A non-volatile multi-state memory device, wherein said device comprises n memory cell arrays consisting of a plurality of non-volatile multi-state memory cells capable of storing multi-state analog amount;

n data register groups respectively corresponding to the n memory cell arrays;

n reading circuit groups for respectively reading analog amounts written in the n memory cell arrays and respectively setting digital data corresponding to each analog amount in the n data register groups;

n transmission circuit groups for transmitting digital data held by the n data register groups to an external portion; and a control circuit for operating an m th transmission circuit (m=1, 2, . . . , n) to sequentially transmit the data held in the m th data register group to an external portion and, after this transmission, operating the (m+1)th transmission circuit group to sequentially transmit the data held in the (m+1)th data register group to an external portion, and also for operating the (m+1)th reading circuit to simultaneously read from a plurality of memory cells in the (m+1)th memory cell array, while transmitting the data held in the m th data register group.

10. A non-volatile multi-state memory device according to claim 9, wherein the control circuit includes a detecting circuit for detecting specification of a specific data register of an m th data register group during transmission by the m th transmission circuit group, and the control circuit controls to read an (m+1)th memory cell array in response to the output of the detecting circuit.

11. A non-volatile multi-state memory device, wherein said memory device comprises n memory cell arrays consisting of a plurality of non-volatile multi-state memory cells capable of storing multi-state analog amounts;

n data register groups consisting of a plurality of data registers for holding digital data;

n writing circuit groups consisting of a plurality of writing circuits for respectively writing analog amounts corresponding to data held in the plurality of data register groups into the plurality of memory cell arrays; and a control circuit for sequentially setting digital data sequentially inputted in a designated period in an m th data register group (m=1, 2, . . . , n) and, after this setting, sequentially setting, in the (m+1)th data register group, digital data inputted sequentially in a designated period, and also for operating the m th writing circuit group during the data setting period of the (m+1)th data register group to simultaneously write to a plurality of memory cells of the m th memory cell array.

12. A non-volatile multi-state memory device, comprising an AD converter for sampling an input analog signal within a designated period and converting it to i-bit digital data (i=a whole number);

j memory cell arrays (j=a whole number) consisting of a plurality of memory cells for respectively storing analog amount; and j writing circuits to which are inputted divided data from the i- bits digital data (i>j) outputted from the AD converter divided at every i/j bits, and for converting the respective divided data to corresponding analog amounts and respectively writing these amounts into the j memory cell arrays.

13. A non-volatile multi-state memory device according to claim 12, wherein the writing circuit includes a data register for holding i/j bit divided data outputted from the AD converter;

a DA converter for converting the data held in the data register to respectively corresponding analog amount; and a comparator for comparing the analog amount converted by the DA converter with the analog amount read from the memory cell; and wherein the writing circuit executes writing to the memory cell in response to a comparison result of the comparator.

14. A non-volatile multi-state memory device according to claim 13, wherein the DA converter comprises a voltage generating circuit for generating a plurality of analog voltages; and a decoder for decoding the data held in the data register and selectively outputting one of the plurality of analog voltages in accordance with the data.

15. A non-volatile multi-state memory device according to claim 14, further comprising a control circuit, wherein in write mode, said control circuit sets data to be written into the memory cell in the data register, activates the writing circuit to write to the memory cell an analog amount corresponding to the set data, and in read mode, said control circuit sequentially sets, in the data register, digital data to be updated in sequence from a designated value and at each respective setting operates the comparator to execute setting, terminates setting of the digital data in the data register in response to the respective comparison result and obtains the digital data corresponding to an analog amount read from the memory cell from the data register.

16. A non-volatile multi-state memory device according to claim 14, wherein the voltage generating circuit consists of a resistance dividing circuit.

17. A non-volatile multi-state memory device according to claim 1, wherein the memory cell consists of an EEPROM element.

* * * * *